(12) United States Patent
Yu et al.

(10) Patent No.: US 10,985,343 B1
(45) Date of Patent: Apr. 20, 2021

(54) DISPLAY PANEL AND MANUFACTURING METHOD OF DISPLAY PANEL AND ELECTRONIC DEVICE

(71) Applicant: Wuhan China Star Optoelectronics Semiconductor Display Technology Co., Ltd., Hubei (CN)

(72) Inventors: Wenjing Yu, Guangdong (CN); Seungkyu Choi, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 483 days.

(21) Appl. No.: 16/074,541

(22) PCT Filed: May 21, 2018

(86) PCT No.: PCT/CN2018/087644
§ 371 (c)(1),
(2) Date: Aug. 1, 2018

(87) PCT Pub. No.: WO2019/174121
PCT Pub. Date: Sep. 19, 2019

(30) Foreign Application Priority Data

Mar. 14, 2018 (CN) .......................... 201810208071.9

(51) Int. Cl.
*H01L 51/52* (2006.01)
*H01L 27/32* (2006.01)
(Continued)

(52) U.S. Cl.
CPC ........ *H01L 51/5253* (2013.01); *H01L 27/322* (2013.01); *H01L 51/0097* (2013.01);
(Continued)

(58) Field of Classification Search
None
See application file for complete search history.

(56) References Cited

U.S. PATENT DOCUMENTS

| 2006/0208633 A1 | 9/2006 | Cheng et al. |
| 2010/0090595 A1* | 4/2010 | Nomura ........... B29D 11/00596 |
| | | 313/506 |

(Continued)

FOREIGN PATENT DOCUMENTS

| CN | 205900543 U | 1/2017 |
| CN | 106405958 A | 2/2017 |

(Continued)

OTHER PUBLICATIONS

Chinese Office Action issued in corresponding Chinese Application No. 201810208071.9, dated May 21, 2020, pp. 1-7, The State Intellectual Property Office of People's Republic of China, Beijing, China.

*Primary Examiner* — J. E. Schoenholtz
(74) *Attorney, Agent, or Firm* — Leong C. Lei

(57) ABSTRACT

A display panel and manufacturing method thereof, and electronic device are provided. The display panel comprises a flexible substrate, thin film transistor layer comprising a drain, anode layer, light-emitting layer, cathode layer and photoresist layer arranged sequentially in a stacked manner, wherein the anode layer and drain are electrically connected; the photoresist layer comprises a first photoresist layer, second photoresist layer and third photoresist layer arranged sequentially at intervals; all of the first, second and third photoresist layer are disposed on the surface of cathode layer; a first dielectric layer filling the space between the first and second photoresist layer, and a second dielectric layer filling the space between the second and third photoresist layer are included, and the first and second dielectric layer (Continued)

are used to absorb light incident from one side of photoresist layer away from cathode layer so as to improve contrast of the display panel.

14 Claims, 15 Drawing Sheets

(51) Int. Cl.
*H01L 51/56* (2006.01)
*H01L 51/00* (2006.01)

(52) U.S. Cl.
CPC .......... *H01L 51/5284* (2013.01); *H01L 51/56* (2013.01); *H01L 2251/5338* (2013.01)

(56) References Cited

U.S. PATENT DOCUMENTS

| | | | |
|---|---|---|---|
| 2014/0191216 A1* | 7/2014 | Matsumoto | H01L 51/5284 257/40 |
| 2019/0206957 A1* | 7/2019 | Yamada | H01L 51/5088 |
| 2019/0206963 A1* | 7/2019 | Zhang | H01L 51/5253 |

FOREIGN PATENT DOCUMENTS

| | | |
|---|---|---|
| CN | 106654047 A | 5/2017 |
| TW | 200635427 A | 10/2006 |

\* cited by examiner

US 10,985,343 B1

DISPLAY PANEL AND MANUFACTURING METHOD OF DISPLAY PANEL AND ELECTRONIC DEVICE

RELATED APPLICATION

The present application is a National Phase of International Application Number PCT/CN2018/087644, filed May 21, 2018, and claims priority to Chinese Patent Application No. 201810208071.9, entitled "display panel, manufacturing method of display panel thereof and electronic device", filed on Mar. 14, 2018, the disclosure of which is incorporated herein by reference.

FIELD OF THE INVENTION

The present disclosure relates to a display field, in particular to a display panel, a manufacturing method of a display panel, and an electronic device.

BACKGROUND OF THE INVENTION

When an electronic device is used outdoor, the display panel of the electronic device has a strong reflection on the sunlight, resulting in a low contrast of the electronic device. To improve the contrast of an electronic device, the usual way is to attach a layer of polarizer (POL) over the display panel. However, when the polarizer absorbs the external sunlight, the light emitted from the display panel is also absorbed by the polarizer by about 55%, thus the contrast of the electronic device not being improved significantly. Hence it would be desirable to provide a new display panel structure to improve the contrast of the display panel significantly.

SUMMARY OF THE INVENTION

The present disclosure provides a display panel comprising a flexible substrate, a thin film transistor layer, an anode layer, a light-emitting layer, a cathode layer and a photoresist layer arranged sequentially in a stacked manner; wherein
the thin film transistor layer comprises a drain electrically connected with the anode layer;
the photoresist layer comprises a first photoresist layer, a second photoresist layer and a third photoresist layer arranged sequentially at intervals, and all of the first photoresist layer, the second photoresist layer and the third photoresist layer are disposed on the surface of the cathode layer;
a first dielectric layer filling the space between the first photoresist layer and the second photoresist layer, and a second dielectric layer filling the space between the second photoresist layer and the third photoresist layer are included, and the first dielectric layer and the second dielectric layer are used to absorb light incident from one side of the photoresist layer away from the cathode layer so as to improve the contrast of the display panel.

The display panel of the present disclosure comprises a flexible substrate, a thin film transistor layer, an anode layer, a light-emitting layer, a cathode layer and a photoresist layer arranged sequentially in a stacked manner, wherein the thin film transistor layer comprises a drain electrically connected with the anode layer, the photoresist layer comprises a first photoresist layer, a second photoresist layer and a third photoresist layer arranged sequentially at intervals, and all of the first photoresist layer, the second photoresist layer and the third photoresist layer are disposed on the surface of the cathode layer, a first dielectric layer filling the space between the first photoresist layer and the second photoresist layer and a second dielectric layer filling the space between the second photoresist layer and the third photoresist layer are included, and the first dielectric layer and the second dielectric layer are used to absorb light incident from one side of the photoresist layer away from the cathode layer, thus improving the contrast of the display panel.

The present disclosure further provides a manufacturing method of a display panel, which is used to manufacture the display panel as described above.

The present disclosure further provides an electronic device and the electronic device comprises the display panel as described above.

BRIEF DESCRIPTION OF THE DRAWINGS

In order to illustrate the structural features and functions of the present disclosure more clearly, the following is illustrated in detail with the accompanying drawings and specific implementations. It is obvious that the drawings in following descriptions are merely some implementations of the present disclosure, those skilled in the art can obtain other drawings according to these drawings without creative work.

DETAILED DESCRIPTION OF THE INVENTION

Hereinafter, a clear and complete description of the technical solutions in the implementations of the present disclosure will be illustrated, which combined with the drawings in the implementations of the present disclosure. Apparently, described implementations are merely a portion of implementations of present disclosure, rather than all of the implementations. Base on the implementations of present disclosure, all other implementations obtained by those skilled in the art without creative work are considered to be encompassed within the scope of the present disclosure.

In order to illustrate the technical solutions provided by the implementations of the present disclosure more clearly, the above technical solutions will be illustrated hereinafter in detail with the accompanying drawings.

Figure 1:
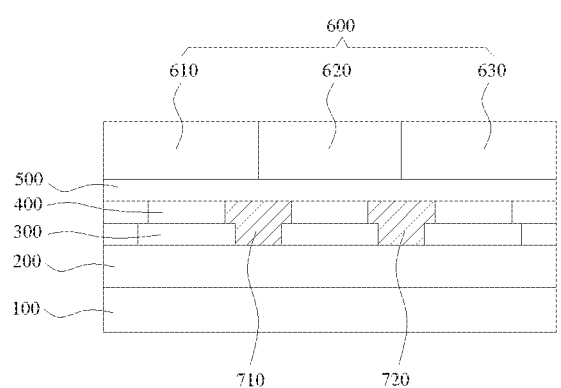
FIG. 1 is a schematic diagram of a display panel provided by an implementation of the present disclosure.

See FIG. 1. FIG. 1 is a schematic diagram of a display panel provided by an implementation of the present disclosure. The display panel 10 comprises a flexible substrate 100, a thin film transistor layer 200, an anode layer 300, a light-emitting layer 400, a cathode layer 500 and a photoresist layer 600 arranged sequentially in a stacked manner, wherein the thin film transistor layer 200 comprises a drain 210 (not shown in FIG. 1), the anode layer 300 and the drain 210 are electrically connected, the photoresist layer 600 comprises a first photoresist layer 610, a second photoresist layer 620 and a third photoresist layer 630 arranged sequentially at intervals, all of the first photoresist layer 610, the second photoresist layer 620 and the third photoresist layer 630 are disposed on the surface of the cathode layer 500, a first dielectric layer 710 filling the space between the first photoresist layer 610 and the second photoresist layer 620, and a second dielectric layer 720 filling the space between the second photoresist layer 620 and the third photoresist layer 630 are included, and the first dielectric layer 710 and the second dielectric layer 720 are used to absorb light incident from one side of the photoresist layer 600 away from the cathode layer 500 so as to improve the contrast of the display panel 10.

The flexible substrate 100 disclosed herein can be made of a polyimide (PI) film or polyester film and a copper foil. Since polyimides have excellent properties in a soldering resistance at high temperature, high strength, high modulus, flame retardance, and the like, polyimides used as polymer materials have outstanding thermal stability, good radiation resistance, chemical stability and excellent mechanical properties.

Figure 2:
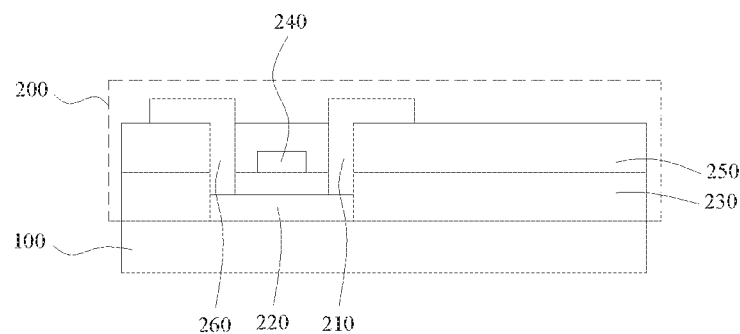
FIG. 2 is a schematic diagram of a thin film transistor layer in an implementation of the present disclosure.

Optionally, in an implementation (see FIG. 2), FIG. 2 is a schematic diagram of a thin film transistor layer in an implementation of the present disclosure, the thin film transistor layer 200 comprises a drain 210, an active layer 220, a first insulating layer 230, a gate 240, a second insulating layer 250 and a source 260. The active layer 220 is disposed on the flexible substrate 100, the active layer 220 is covered by the first insulating layer 230, the gate 240 is disposed on the first insulating layer 230, and the gate 240 is arranged corresponding to the active layer 220, and the gate 240 is covered by the second insulating layer 250. The drain 210 and the source 260 are both arranged on the second insulating layer 250, the drain 210 and the source 260 are arranged at intervals, the source 260 is electrically connected with one end of the active layer 220 through a through-hole provided on the first insulating layer 230 and the second insulating layer 250, and the drain 210 is electrically connected with another end of the active layer 220 through a through-hole provided on the first insulating layer 230 and the second insulating layer 250.

Optionally, the light-emitting layer 400 is an organic light-emitting layer.

Optionally, the anode layer 300 is disposed on the surface of the drain 210, and the anode layer 300 is electrically connected with the drain 210. The electrical connection disclosed herein between the anode layer 300 and the drain 210 can be a direct electrical connection or a bridge connection.

Optionally, in an implementation, the first photoresist layer 610 is a red photoresist (R photoresist), the second photoresist layer 620 is a green photoresist (G photoresist), and the third photoresist layer 630 is a blue photoresist (B photoresist).

Optionally, the first dielectric layer 710 and the second dielectric layer 720 can be black organic materials, or other black insulating materials, and the first dielectric layer and the second dielectric layer can be the same materials or different materials. The first dielectric layer 710 has at least the functions of following several aspects: firstly, preventing light between the two adjacent first photoresist layers 610 and the second photoresist layer 620 from mixing, resulting in poor display effect; secondly, forming an insulating isolation between the first photoresist layer 610 and the second photoresist layer 620 to prevent the poor display resulting from mutual interference between the light emitted from the light-emitting layer corresponding to the first photoresist layer 610 and the light emitted from the light-emitting layer corresponding to the second photoresist layer 620; thirdly, first dielectric layer 710 being used to absorb the external light, to be exact, to absorb the light incident from one side of the photoresist layer 600 away from the cathode layer 500, and to reduce the reflectivity of the light, thus improving the contrast of the display panel 10. The second dielectric layer 720 has at least the functions of following several aspects: firstly, preventing light between the two adjacent second photoresist layers 620 and the third photoresist layer 630 from mixing, resulting in poor display effect; secondly, forming an insulating isolation between the second photoresist layer 620 and the third photoresist layer 630, to prevent the poor display resulting from mutual interference between the light emitted from the light-emitting layer corresponding to the second photoresist layer 620 and the light emitted from the light-emitting layer corresponding to the third photoresist layer 630; thirdly, second dielectric layer 720 being used to absorb the external light, to be exact, to absorb the light incident from one side of the photoresist layer 600 away from the cathode layer 500, and to reduce the reflectivity of the light, thus improving the contrast of the display panel 10.

The display panel provided by the technical solution of the present disclosure comprises a flexible substrate, a thin film transistor layer, an anode layer, a light-emitting layer, a cathode layer and a photoresist layer arranged sequentially in a stacked manner, wherein the thin film transistor layer comprises a drain electrically connected with the anode layer, the photoresist layer comprises a first photoresist layer, a second photoresist layer and a third photoresist layer arranged sequentially at intervals, the first photoresist layer, all of the second photoresist layer and the third photoresist layer are disposed on the surface of the cathode layer, a first dielectric layer filling the space between the first photoresist layer and the second photoresist layer, a second dielectric layer filling the space between the second photoresist layer and the third photoresist layer are included, and the first dielectric layer and the second dielectric layer are used to absorb light incident from one side of the photoresist layer away from the cathode layer, thus improving the contrast of the display panel.

Figure 3:
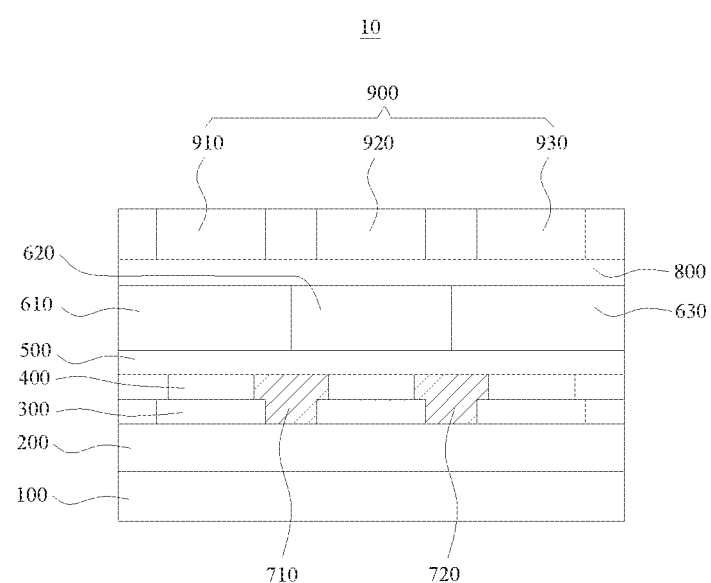
FIG. 3 is a schematic diagram of another display panel provided by an implementation of the present disclosure.

See FIG. 3. FIG. 3 is a schematic diagram of another display panel provided by an implementation of the present disclosure. In the implementation, the display panel 10 further comprises a thin film encapsulation layer 800 and a color filter layer 900, the thin film encapsulation layer 800 is disposed on the surface of the photoresist layer 600 away from the cathode layer 500 and used to protect the photoresist layer 600, the color filter layer 900 is disposed on the surface of the thin film encapsulation layer 800 away from the photoresist layer 600, the color filter layer 900 comprises a first filter layer 910, a second filter layer 920 and a third filter layer 930 arranged sequentially and adjacently, the first filter layer 910 is arranged opposite to at least a part of area of the first photoresist layer 610, the second filter layer 920 is arranged opposite to at least a part of area of the second photoresist layer 620, the third filter layer 930 is arranged opposite to at least a part of area of the third photoresist layer 630.

Optionally, in an implementation, the first filter layer 910 is a red filter, the second filter layer 920 is a green filter, and the third filter layer 930 is a blue filter. The red filter disclosed herein can allow red light to transmit through, the green filter can allow green light to transmit through and the blue filter can allow blue light to transmit through. The present disclosure provides details of an exemplary implementation where a red filter is used as the first filter layer 910, a green filter is used as the second filter layer 920, and a blue filter is used as the third filter layer 930.

Optionally, in an implementation, the first filter layer 910 is arranged opposite to the entire area of the first photoresist layer 610. Understandably, in another implementation, the first filter layer 910 is arranged opposite to a part of area of the first photoresist layer 610. Similarly and optionally, in one implementation, the second filter layer 920 is arranged opposite to the entire area of the second photoresist layer 620, and understandably, in another implementation, the second filter layer 920 is arranged opposite to a part of area of the second photoresist layer 620. Similarly and optionally, in one implementation, the third filter layer 930 is arranged opposite to the entire area of the third photoresist layer 630, and understandably, in another implementation, the third filter layer 930 is arranged opposite to a part of area of the third photoresist layer 630. The arrangement of the first filter layer 910, the second filter layer 920 and the third filter layer 930 is not limited in the present disclosure, and any arrangement that does not violate the original intention of the present disclosure is within the claimed scope of the present disclosure.

Figure 4:
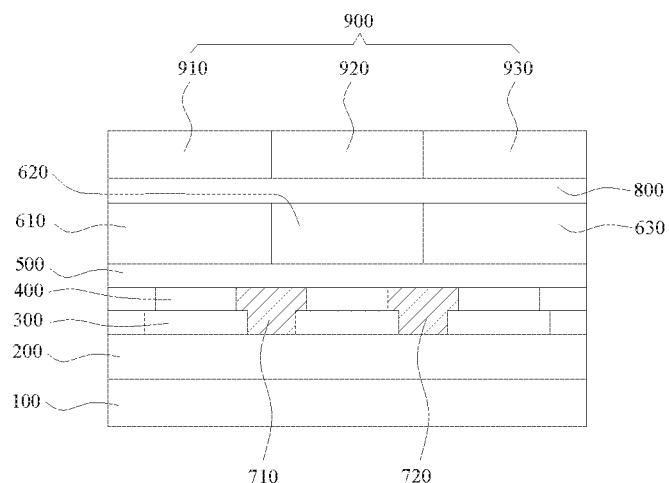
FIG. 4 is a schematic diagram of another display panel provided by an implementation of the present disclosure.

See FIG. 4. FIG. 4 is a schematic diagram of another display panel provided by an implementation of the present disclosure. In the implementation, the second filter layer 920 is configured to fit the first filter layer 910 so as to cover the first dielectric layer 710, or the second filter layer 920 is configured to fit the third filter layer 930 so as to cover the second dielectric layer 720.

Specifically, in an implementation, the second filter layer 920 is configured to fit the first filter layer 910 so as to cover the first dielectric layer 710, and the second filter layer 920 and the third filter layer 930 are arranged at intervals. Since the second filter layer 920 is configured to fit the first filter layer 910 so as to cover the first dielectric layer 710 in the technical solution, the phenomenon that the external light will be reflected back by the film packaging layer 800 will be improved when the external light is irradiated to the area between the adjacent first filter layer 910 and the second filter layer 920, thus increasing the contact area between the first filter layer 910, the second filter layer 920 and the external light, and allowing a part of the external light to transmit through the first filter layer 910 and the second filter layer 920. Further, the light transmitted through the first filter layer 910 and the second filter layer 920 can be absorbed by the first dielectric layer 710, so that more light can enter the non-light-emitting zone, thus improving the contrast of the display panel 10.

Optionally, in another implementation, the first filter layer 910 and the second filter layer 920 are arranged at intervals, and the second filter layer 920 is configured to fit the third filter layer 930 so as to cover the second dielectric layer 720. Since the second filter layer 920 is configured to fit the third filter layer 930 so as to cover the second dielectric layer 720 in the technical solution, the phenomenon that the external light will be reflected back by the film packaging layer 800 will be improved when the external light is irradiated to the area between the adjacent second filter layer 920 and the third filter layer 930, thus increasing the contact area between the second filter layer 920, the third filter layer 930 and the external light, and allowing a part of the external light to transmit through the second filter layer 920 and the third filter layer 930. Further, the light transmitted through the second filter layer 920 and the third filter layer 930 can be absorbed by the second dielectric layer 720, so that more light can enter the non-light-emitting zone, thus improving the contrast of the display panel 10.

Optionally, in another implementation, the second filter layer 920 is configured to fit the first filter layer 910 so as to cover the first dielectric layer 710, and the second filter layer 920 is configured to fit the third filter layer 930 so as to cover the second dielectric layer 720. See FIG. 4. Specifically, since the second filter layer 920 is configured to fit the first filter layer 910 so as to cover the first dielectric layer 710, and the second filter layer 920 is configured to fit the third filter layer 930 so as to cover the second dielectric layer 720, the contact area between first filter layer 910, the second filter layer 920, the third filter layer 930 and the external light is increased and a part of the external light is allowed to transmit through first filter layer 910, the second filter layer 920 and the third filter layer 930. Further, the light transmitted through first filter layer 910, the second filter layer 920 and the third filter layer 930 can be absorbed by the first dielectric layer 710 and the second dielectric layer 720, so that more light can enter the non-light-emitting zone, thus improving the contrast of the display panel 10.

Figure 5:
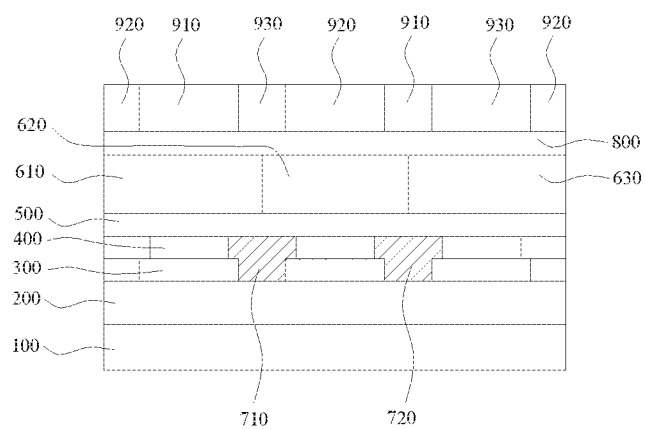
FIG. 5 is a schematic diagram of another display panel provided by an implementation of the present disclosure.

See FIG. 5. FIG. 5 is a schematic diagram of another display panel provided by an implementation of the present disclosure. In the implementation, the display panel 10 further comprises a thin film encapsulation layer 800 and a color filter layer 900, the thin film encapsulation layer 800 is disposed on the surface of the photoresist layer 600 away from the cathode layer 500 and used to protect the photoresist layer 600, the color filter layer 900 is disposed on the surface of the thin film encapsulation layer 800 away from the photoresist layer 600, the color filter layer 900 comprises a first filter layer 910, a second filter layer 920 and a third filter layer 930 arranged sequentially at intervals, the first filter layer 910 is arranged opposite to at least a part of area of the first photoresist layer 610, the second filter layer 920 is arranged opposite to at least a part of area of the second photoresist layer 620, the third filter layer 930 is arranged opposite to at least a part of area of the third photoresist layer 630, and at least one of the first filter layer 910, the second filter layer 920 and the third filter layer 930 fills the space between the first filter layer 910 and the second filter layer 920, or the space between the second filter layer 920 and the third filter layer 930.

See FIG. 5. Specifically, the present disclosure provides details of an exemplary implementation where the third filter layer 930 fills the space between the first filter layer 910 and the second filter layer 920, the first filter layer 910 fills the space between the second filter layer 920 and the third filter layer 930, and the second filter layer 920 fills the space between the first filter layer 910 and the third filter layer 930.

Specifically, the third filter layer 930 fills the blank area between the first filter layer 910 and the second filter layer 920, the first filter layer 910 fills the blank area between the second filter layer 920 and the third filter layer 930, and the second filter layer 920 fills the blank area between the first filter layer 910 and the third filter layer 930, the contact area between first filter layer 910, the second filter layer 920, the third filter layer 930 and the external light is increased, thus allowing a part of the external light to transmit through first filter layer 910, the second filter layer 920 and the third filter layer 930. Further, the light transmitted through first filter layer 910, the second filter layer 920 and the third filter layer 930 can be absorbed by the first dielectric layer 710 and the second dielectric layer 720, so that more light can enter the non-light-emitting zone, thus improving the contrast of the display panel 10.

Figure 6:
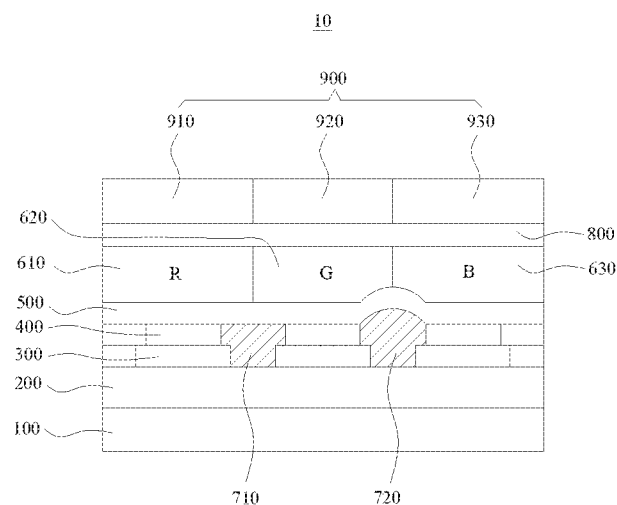
FIG. 6 is a schematic diagram of another display panel provided by an implementation of the present disclosure.

Optionally, in some implementations, the first photoresist layer 610 is a red photoresist (R photoresist), the second photoresist layer 620 is a green photoresist (G photoresist), and the third photoresist layer 630 is a blue photoresist (B photoresist), the first dielectric layer 710 and the second dielectric layer 720 are the same materials, and the filling amount of the second dielectric layer 720 is larger than that of the first dielectric layer 710. Specifically, See FIG. 6. FIG. 6 is a schematic diagram of another display panel provided by an implementation of the present disclosure.

Specifically, since green photoresist has the highest luminous efficiency, followed by red photoresist, and blue photoresist has the lowest luminous efficiency, the luminous efficiency of the first photoresist layer 610, the second photoresist layer 620 and the third photoresist layer 630 is different. Therefore, when the first dielectric layer 710 and the second dielectric layer 720 are the same materials in the implementation, the filling amount of the second dielectric layer 720 is set to a little more and the filling amount of the first dielectric layer 710 is set to a little less, which can make more external light be absorbed by the second dielectric layer 720 and decrease the reflectivity of external light, so that more light can enter the non-light-emitting zone, thus significantly improving the contrast of the display panel 10.

Figure 7:
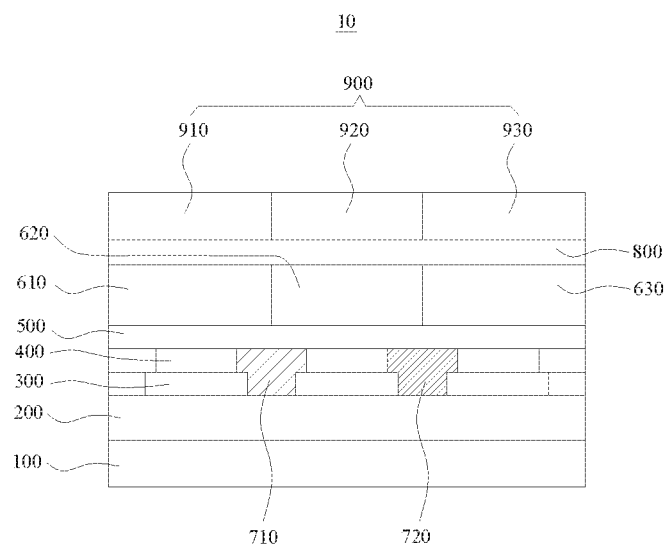
FIG. 7 is a schematic diagram of another display panel provided by an implementation of the present disclosure.

Optionally, in another implementations, the first photoresist layer 610 is a red photoresist, the second photoresist layer 620 is a green photoresist, and the third photoresist layer 630 is a blue photoresist, the first dielectric layer 710 and the second dielectric layer 720 are different materials, and the density of the second dielectric layer 720 is larger than that of the first dielectric layer 710. See FIG. 7. Specifically, FIG. 7 is a schematic diagram of another display panel provided by an implementation of the present disclosure.

Specifically, since green photoresist has the highest luminous efficiency, followed by red photoresist, and blue photoresist has the lowest luminous efficiency, the luminous efficiency of the first photoresist layer 610, the second photoresist layer 620 and the third photoresist layer 630 is different. Therefore, when the first dielectric layer 710 and the second dielectric layer 720 are different materials and the filling amount of the first dielectric layer 710 and the second dielectric layer 720 is equal in the implementation, the density of the second dielectric layer 720 is set to a little larger and the filling amount of the first dielectric layer 710 is set to a little smaller, which can make more external light be absorbed by the second dielectric layer 720 and decrease the reflectivity of external light, so that more light can enter the non-light-emitting zone, thus improving the contrast of the display panel 10.

Figure 8:
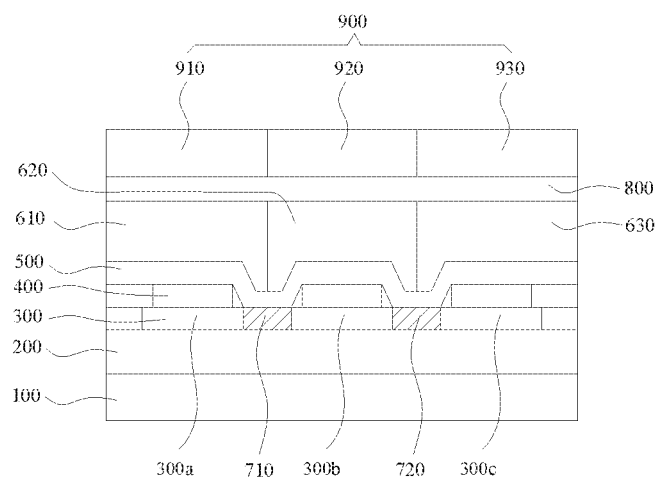
FIG. 8 is a schematic diagram of another display panel provided by an implementation of the present disclosure.

Optionally, in other implementations, the first dielectric layer 710, the second dielectric layer 720 and the anode layer 300 are disposed in the same layer. Specifically, See FIG. 8. FIG. 8 is a schematic diagram of another display panel provided by an implementation of the present disclosure.

Specifically, the first dielectric layer 710, the second dielectric layer 720 and the anode layer 300 are disposed in the same layer in the implementation. Specific realization process can comprise: firstly, depositing a whole layer of anodic metal layer, and then etching the anode metal layer to form a plurality of anode layers 300 arranged in an array, and adjacent anode layers 300 are arranged at intervals. For the convenience of description, the three adjacent anode layers are labeled as anode layer 300a, anode layer 300b and anode layer 300c, respectively. The gap between the anode layer 300a and the anode layer 300b is called a first via-hole (unlabeled in the figure), and then deposit a layer of black organic materials in the first via-hole to form the first dielectric layer 710. The gap between the anode layer 300b and the anode layer 300c is called a second via-hole (unlabeled in the figure), and then deposit a layer of black organic materials in the first via-hole to form the second dielectric layer 720.

Figure 9:
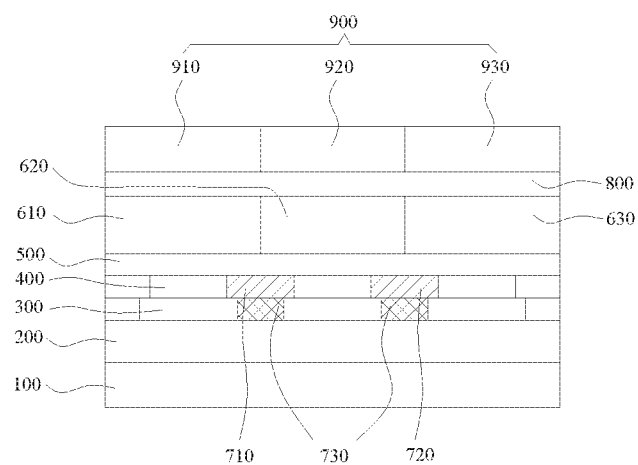
FIG. 9 is a schematic diagram of another display panel provided by an implementation of the present disclosure.

Or the first dielectric layer 710, the second dielectric layer 720 and the light-emitting layer 400 are disposed in the same layer. Specifically, See FIG. 9, FIG. 9 is a schematic diagram of another display panel provided by an implementation of the present disclosure.

Specifically, in the implementation, the first dielectric layer 710, the second dielectric layer 720 and the light-emitting layer 400 are disposed in the same layer, and insulating materials 730 fill the area between adjacent anode layers 300. Firstly, deposit a whole layer of anodic metal layer, and then etch the anode metal layer to form a plurality of anode layers 300 arranged in an array, and adjacent anode layers 300 are arranged at intervals. Form a first via-hole (unlabeled in the figure) penetrating the anode metal layer, which is arranged opposite to the area between the first photoresist layer 610 and the second photoresist layer 620, and then deposit a layer of insulating materials 730 in the first via-hole. Similarly, etch light-emitting dielectric layer to form a plurality of light-emitting layer 400 arranged in an array, and adjacent light-emitting layers 400 are arranged at intervals. Form a second via-hole (unlabeled in the figure) penetrating the light-emitting dielectric layer, which is arranged opposite to the area between the second photoresist layer 620 and the third photoresist layer 630, and then deposit a layer of insulating materials 730 in the second via-hole. Since insulating materials 730 are arranged in the area between adjacent two anode layers 300 in the technical solution, an insulation isolation is formed for adjacent two anode layers 300, thus realizing separate control for different photoresist and achieving different display effects of display panel 10. Further, deposit a whole layer of light-emitting dielectric layer, and then etch the light-emitting dielectric layer to form a third via-hole (unlabeled in the figure) penetrating the light-emitting dielectric layer, which is arranged opposite to the area between the first photoresist layer 610 and the second photoresist layer 620, and then deposit a layer of insulating materials in the third via-hole to form the first dielectric layer 710. Similarly, etch the light-emitting dielectric layer to form a fourth via-hole (unlabeled in the figure) penetrating the light-emitting dielectric layer, which is arranged opposite to the area between the first photoresist layer 610 and the second photoresist layer 620, and then deposit a layer of insulating materials in the fourth via-hole to form the second dielectric layer 720.

Figure 10:
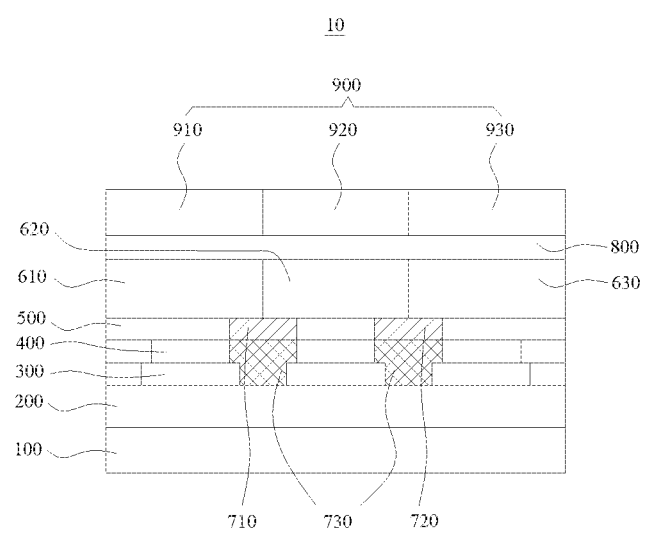
FIG. 10 is a schematic diagram of another display panel provided by an implementation of the present disclosure.

Or the first dielectric layer 710, the second dielectric layer 720 and the cathode layer 500 are disposed in the same layer. See FIG. 10. Specifically, FIG. 10 is a schematic diagram of another display panel provided by an implementation of the present disclosure.

Specifically, there is a need to patterning the cathode layer 500 in the implementation, so that the first dielectric layer 710, the second dielectric layer 720 and the cathode layer 500 are disposed in the same layer. Firstly, deposit a whole layer of anodic metal layer, then deposit a whole layer of light-emitting dielectric layer, and then etch the anode metal layer and the light-emitting dielectric layer simultaneously to form a first via-hole (unlabeled in the figure) penetrating the anode metal layer and the light-emitting dielectric layer simultaneously, which is arranged opposite to the area between the first photoresist layer 610 and the second photoresist layer 620, and then deposit a layer of insulating materials 730 in the first via-hole. Similarly, etch the anode metal layer and the light-emitting dielectric layer simultaneously to form a second via-hole (unlabeled in the figure) penetrating the anode metal layer and the light-emitting dielectric layer, which is arranged opposite to the area between the second photoresist layer 620 and the third photoresist layer 630, and then deposit a layer of insulating materials 730 in the second via-hole. Since insulating materials 730 are arranged in the area between adjacent two anode layers 300 in the technical solution, an insulation isolation is formed for adjacent two anode layers 300, thus realizing separate control for different photoresist and achieving different display effect of display panel 10. Moreover, since insulating materials 730 are arranged in the area between adjacent two light-emitting layers 400, an insulation isolation is formed for adjacent two light-emitting layers 400, thus preventing the poor display resulting from the occurrence of light mixing. Therefore, the technical solution can realize separate control of different photoresist, and then achieve different display effect of the display panel on the one hand, and on the other hand, it can also avoid the occurrence of the phenomenon of light mixing.

The display panel provided by the technical solution of the present disclosure comprises a flexible substrate, a thin film transistor layer, an anode layer, a light-emitting layer, a cathode layer and a photoresist layer arranged sequentially in a stacked manner, wherein the thin film transistor layer comprises a drain, the anode layer and the drain are electrically connected, the photoresist layer comprises a first photoresist layer, a second photoresist layer and a third photoresist layer arranged sequentially at intervals, all of the first photoresist layer, the second photoresist layer and the third photoresist layer are disposed on the surface of the cathode layer, a first dielectric layer filling the space between the first photoresist layer and the second photoresist layer, and a second dielectric layer filling the space between the second photoresist layer and the third photoresist layer are included, and the first dielectric layer and the second dielectric layer are used to absorb light incident from one side of the photoresist layer away from the cathode layer, thus improving the contrast of the display panel.

Figure 11:
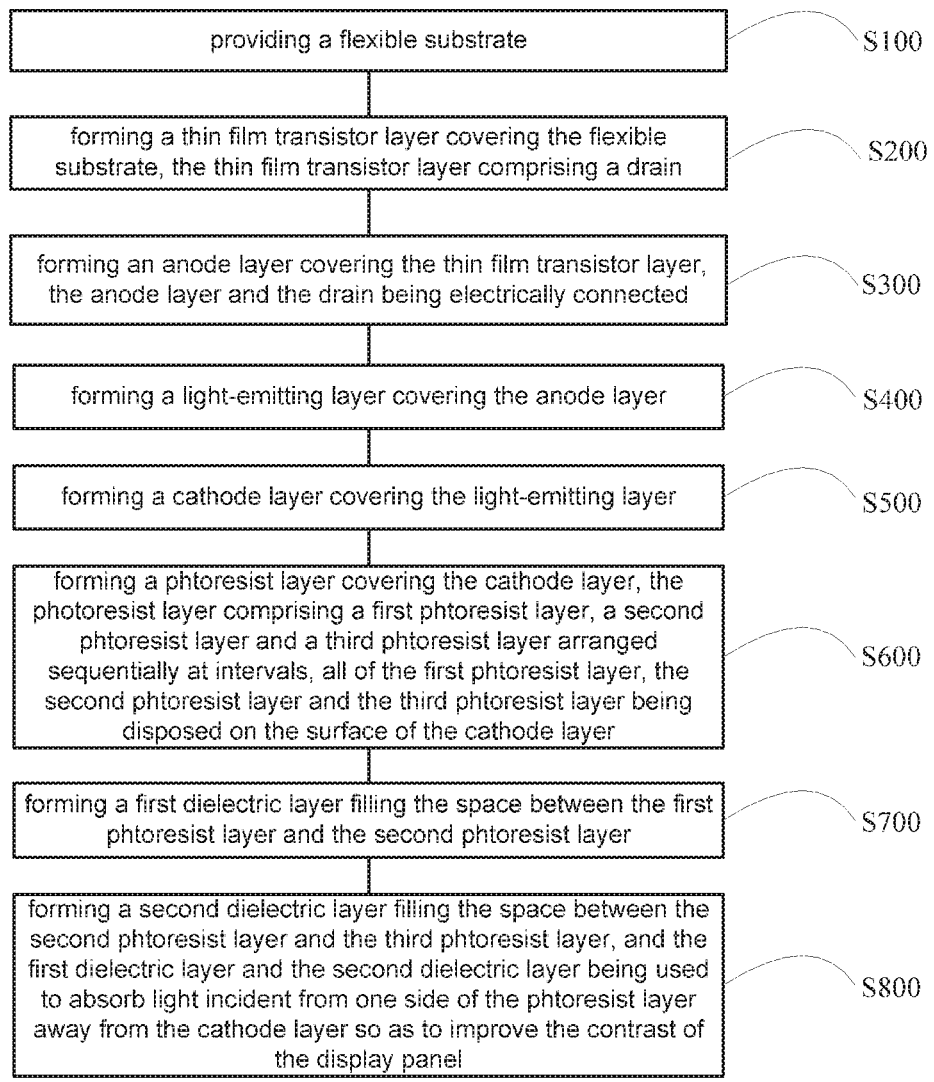
FIG. 11 is a flow diagram illustrating a manufacturing method of a display panel provided by an implementation of the present disclosure.

See FIG. 11. FIG. 11 is a flow diagram illustrating a manufacturing method of a display panel provided by an implementation of the present disclosure. The manufacturing method of the display panel 10 includes but is not limited to, steps of S100, S200, S300, S400, S500, S600, S700 and S800, and detailed descriptions of steps of S100, S200, S300, S400, S500, S600, S700 and S800 are as follows.

Figure 12:
FIG. 12 is a schematic diagram corresponding to the step of S100 in an implementation of the present disclosure.

At S100, a flexible substrate is provided. See FIG. 12.

The flexible substrate 100 disclosed herein can be made of a polyimide (PI) film or polyester film and a copper foil. Since polyimides have excellent properties in a soldering resistance at high temperature, high strength, high modulus, flame retardance and the like, polyimides used as polymer materials have outstanding thermal stability, good radiation resistance, chemical stability and excellent mechanical properties.

Figure 13:
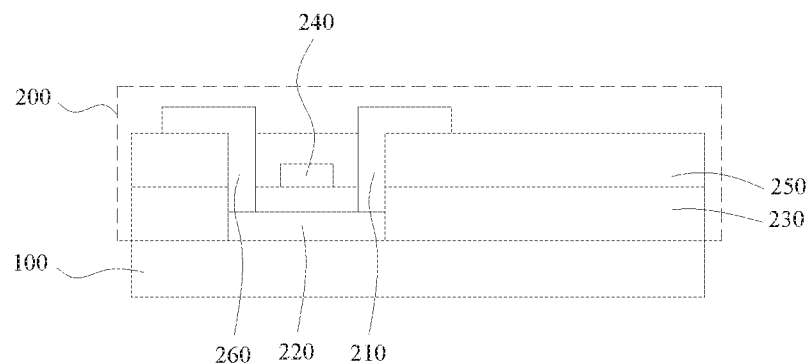
FIG. 13 is a schematic diagram corresponding to the step of S200 in an implementation of the present disclosure.

At S200, a thin film transistor layer 200 covering the flexible substrate 100 is formed, and the thin film transistor layer 200 comprises a drain 210. See FIG. 13.

Specifically, the thin film transistor layer 200 comprises a drain 210, an active layer 220, a first insulating layer 230, a gate 240, a second insulating layer 250 and a source 260. The active layer 220 is disposed on the flexible substrate 100, the active layer 220 is covered by the first insulating layer 230, the gate 240 is disposed on the first insulating layer 230, and the gate 240 is arranged corresponding to the active layer 220, and the gate 240 is covered by the second insulating layer 250. The drain 210 and the source 260 are both arranged on the second insulating layer 250, the drain 210 and the source 260 are arranged at intervals, the source 260 is electrically connected with one end of the active layer 220 through a through-hole provided on the first insulating layer 230 and the second insulating layer 250, and the drain 210 is electrically connected with another end of the active layer 220 through a through-hole provided on the first insulating layer 230 and the second insulating layer 250.

Figure 14:
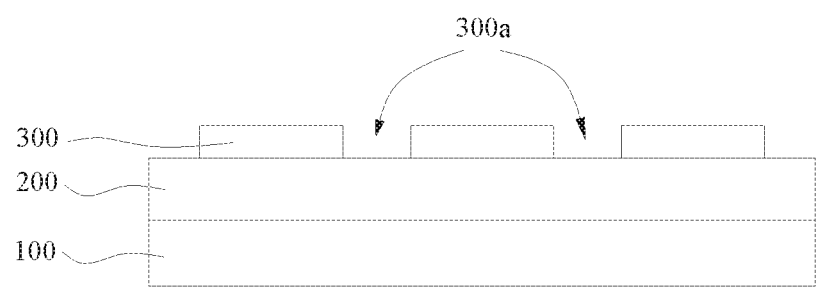
FIG. 14 is a schematic diagram corresponding to the step of S300 in an implementation of the present disclosure.

At S300, an anode layer 300 covering the thin film transistor layer 200 is formed, and the anode layer 300 is electrically connected with the drain 210 (not shown in figures). See FIG. 14.

Specifically, firstly, deposit a whole layer of anodic metal layer, and then etch the anode metal layer to form a plurality of anode layers 300 arranged in an array, and adjacent anode layers 300 are arranged at intervals. For the convenience of description, the three adjacent anode layers are labeled as anode layer 300a, anode layer 300b, and anode layer 300c, respectively. The gap between the anode layer 300a and the anode layer 300b is called a first via-hole (unlabeled in figures).

Figure 15:
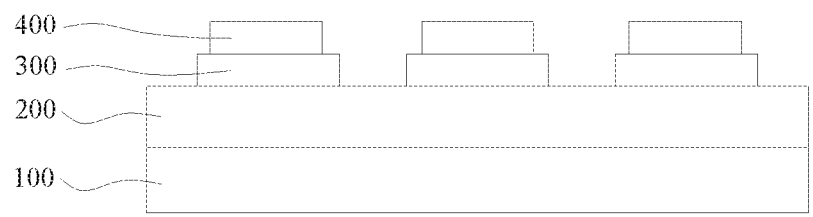
FIG. 15 is a schematic diagram corresponding to the step of S400 in an implementation of the present disclosure.

At S400, a light-emitting layer 400 covering the anode layer 13 is formed. See FIG. 15.

Figure 16:
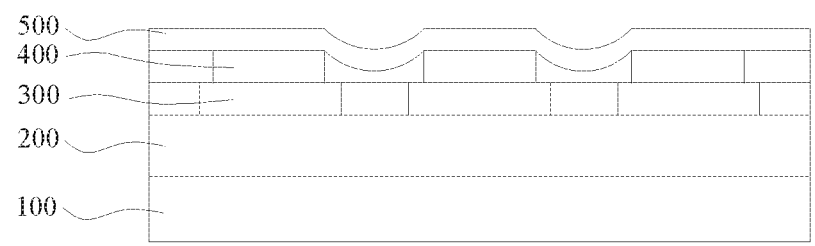
FIG. 16 is a schematic diagram corresponding to the step of S500 in implementations of the disclosure.

At S500, a cathode layer 500 covering the light-emitting layer 400 is formed. See FIG. 16.

Figure 17:
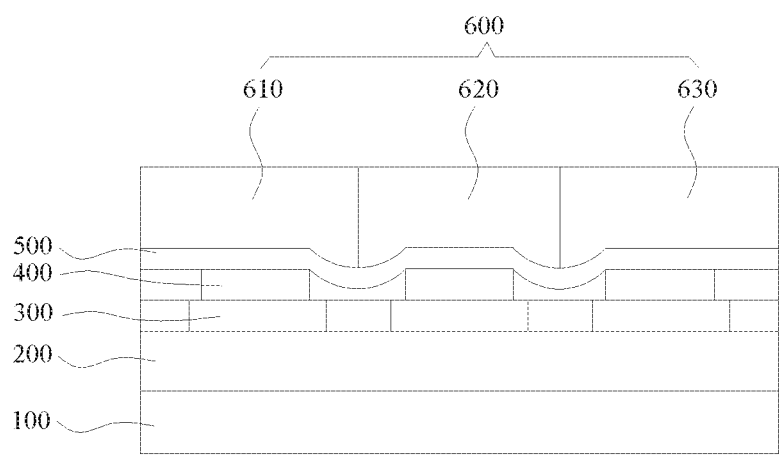
FIG. 17 is a schematic diagram corresponding to the step of S600 in an implementation of the present disclosure.

At S600, a photoresist layer 600 covering the cathode layer 500 is formed, the photoresist layer 600 comprises a first photoresist layer 610, a second photoresist layer 620 and a third photoresist layer 630 arranged sequentially at intervals, and all of the first photoresist layer 610, the second photoresist layer 620 and the third photoresist layer 630 are disposed on the surface of the cathode layer 500. See FIG. 17.

Figure 18:
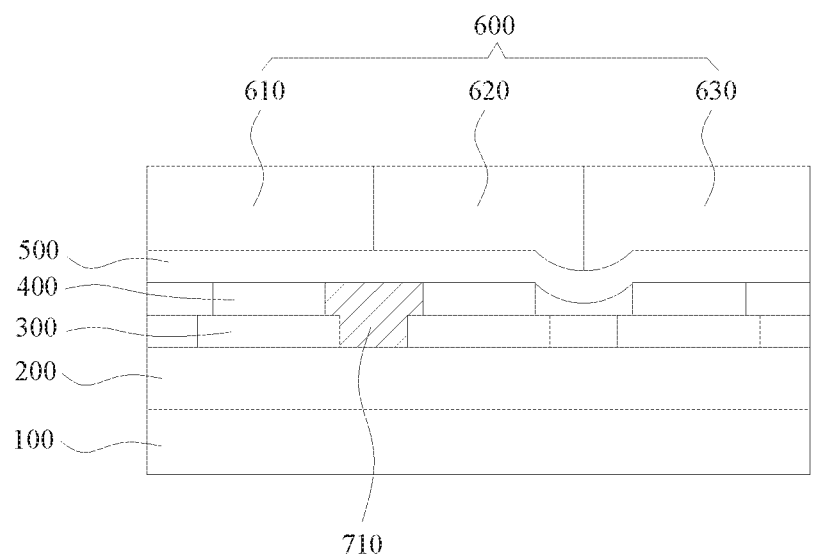
FIG. 18 is a schematic diagram corresponding to the step of S700 in an implementation of the present disclosure.

At S700, a first dielectric layer 710 filling the space between the first photoresist layer 610 and the second photoresist layer 620 is formed. See FIG. 18.

Figure 19:
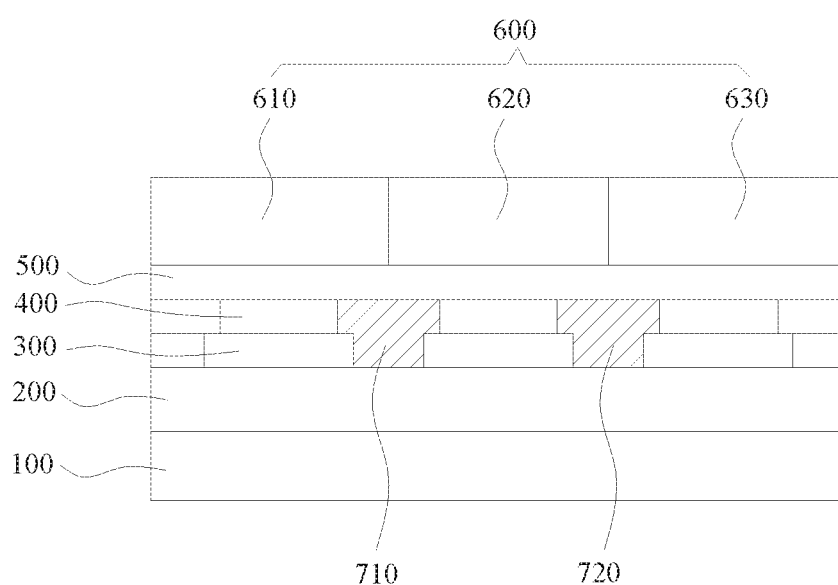
FIG. 19 is a schematic diagram corresponding to the step of S800 in an implementation of the present disclosure.

At S800, a second dielectric layer 720 filling the space between the second photoresist layer 620 and the third photoresist layer 630 is formed, and the first dielectric layer 710 and the second dielectric layer 720 are used to absorb light incident from one side of the photoresist layer 600 away from the cathode layer 500 so as to improve the contrast of the display panel 10. See FIG. 19.

Figure 20:
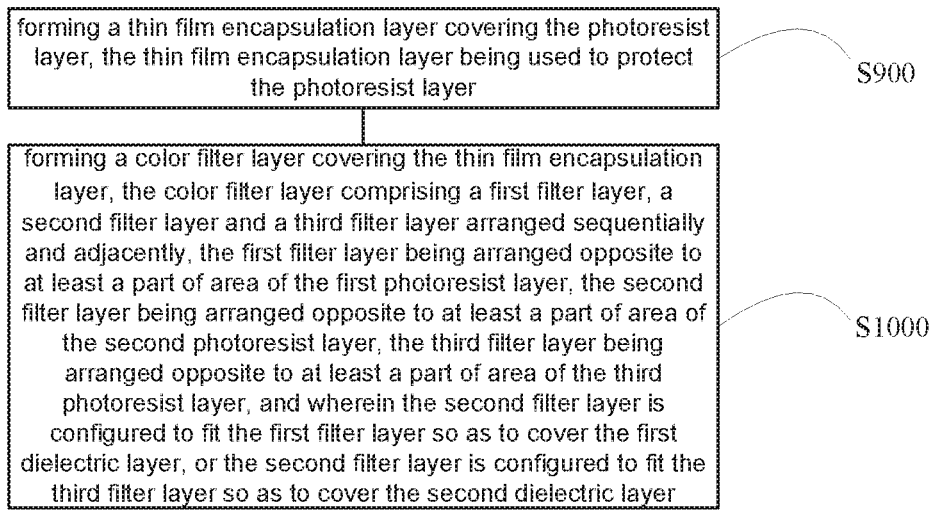
FIG. 20 is a local flow diagram illustrating a manufacturing method of a display panel in an implementation of the present disclosure.

See FIG. 20. FIG. 20 is a local flow diagram illustrating a manufacturing method of a display panel in an implementation of the present disclosure. In one implementation, the manufacturing method of the display panel 10 includes but is not limited to, steps of S900 and S1000, and detailed descriptions of steps of S900 and S1000 are as follows.

Figure 21:
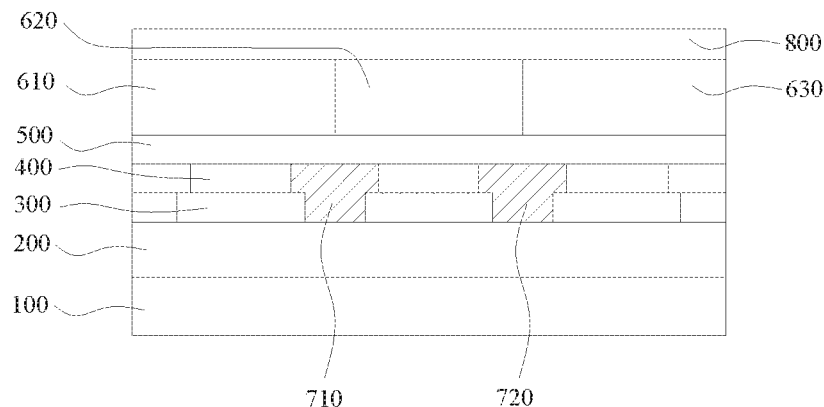
FIG. 21 is a schematic diagram corresponding to the step of S900 in an implementation of the present disclosure.
Figure 22:
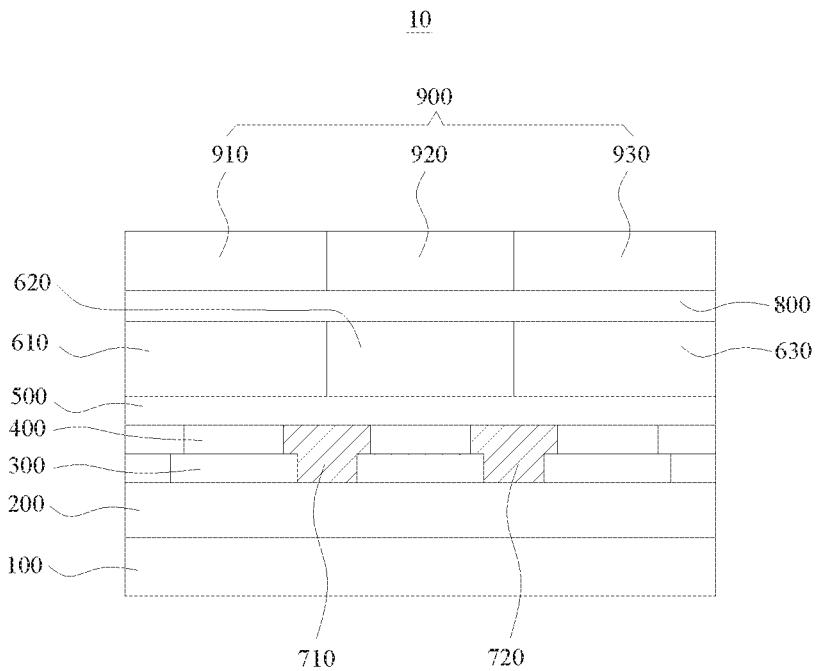
FIG. 22 is a schematic diagram corresponding to the step of S1000 in an implementation of the present disclosure.

At S900, a thin film encapsulation layer 800 covering the photoresist layer 600 is formed, and the thin film encapsulation layer 800 is used to protect the photoresist layer 600. See FIG. 21.

At S1000, a color filter layer 900 covering the thin film encapsulation layer 800 is formed, the color filter layer 900 comprises a first filter layer 910, a second filter layer 920 and a third filter layer 930 arranged sequentially and adjacently, the first filter layer 910 is arranged opposite to at least a part of area of the first photoresist layer 610, the second filter layer 920 is arranged opposite to at least a part of area of the second photoresist layer 620, the third filter layer 930 is arranged opposite to at least a part of area of the third photoresist layer 630, and the second filter layer 920 is configured to fit the first filter layer 910 so as to cover the first dielectric layer 710, or the second filter layer 920 is configured to fit the third filter layer 930 so as to cover the second dielectric layer 720.

Figure 23:
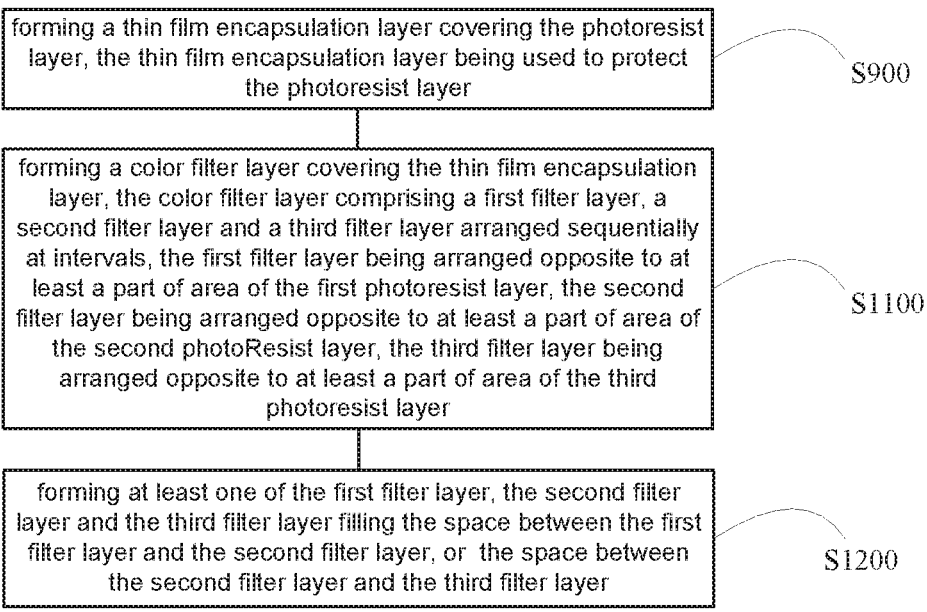
FIG. 23 is a local flow diagram illustrating a manufacturing method of a display panel in an implementation of the present disclosure.

See FIG. 23. FIG. 23 is a local flow diagram illustrating a manufacturing method of a display panel in an implementation of the present disclosure. In another implementation, the manufacturing method of the display panel 10 includes but is not limited to, steps of S900, S1100 and S1200, and detailed descriptions of steps of S900, S1100 and S1200 are as follows.

Figure 24:
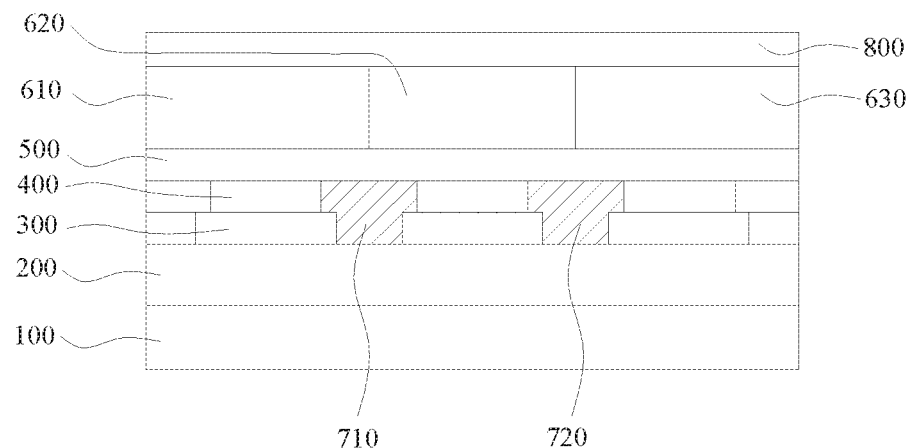
FIG. 24 is a schematic diagram corresponding to the step of S910 in an implementation of the present disclosure.

At S900, a thin film encapsulation layer 800 covering the photoresist layer 600 is formed, and the thin film encapsulation layer 800 is used to protect the photoresist layer 600. See FIG. 24.

Figure 25:
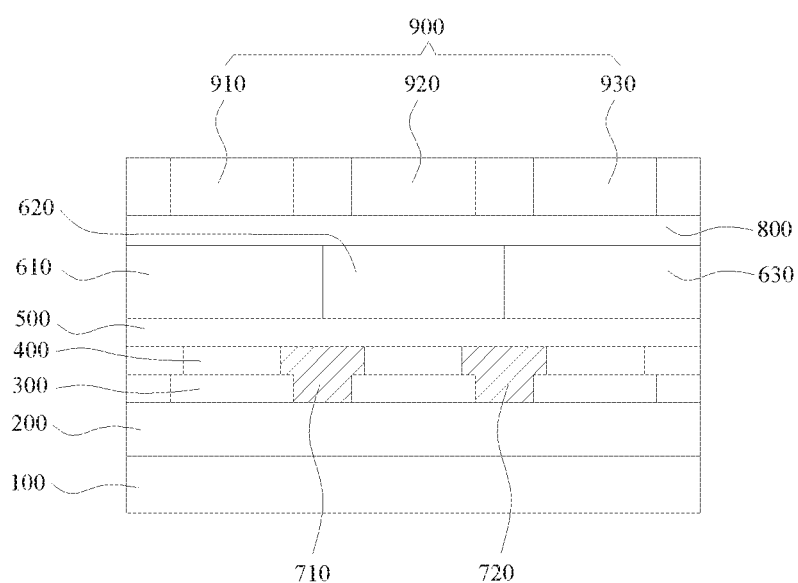
FIG. 25 is a schematic diagram corresponding to the step of S1100 in an implementation of the present disclosure.

At S1100, a color filter layer 900 covering the thin film encapsulation layer 800 is formed, the color filter layer 900 comprises a first filter layer 910, a second filter layer 920 and a third filter layer 930 arranged sequentially at intervals, the first filter layer 910 is arranged opposite to at least a part of area of the first photoresist layer 610, the second filter layer 920 is arranged opposite to at least a part of area of the second photoresist layer 620, the third filter layer 930 is arranged opposite to at least a part of area of the third photoresist layer 630. See FIG. 25.

At S1200, at least one of the first filter layer 910, the second filter layer 920 and the third filter layer 930 filling the space between the first filter layer 910 and the second filter layer 920, or between the second filter layer 920 and the third filter layer 930 is formed.

Figure 26:
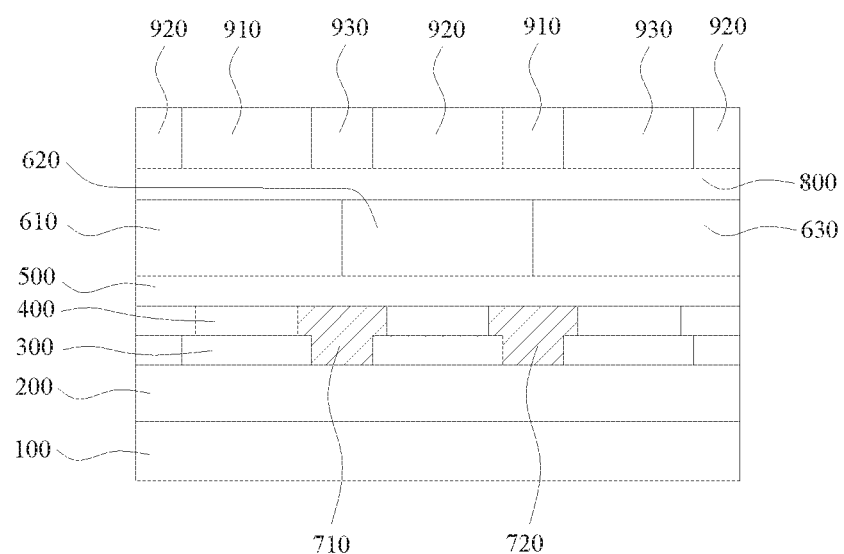
FIG. 26 is a schematic diagram corresponding to the step of S1200 in an implementation of the present disclosure.

See FIG. 26. Specifically, the third filter layer 930 fills the blank area between the first filter layer 910 and the second filter layer 920, the first filter layer 910 fills the blank area between the second filter layer 920 and the third filter layer 930, and the second filter layer 920 fills the blank area between the first filter layer 910 and the third filter layer 930, the contact area between first filter layer 910, the second filter layer 920, the third filter layer 930 and the external light is increased, thus allowing a part of the external light to transmit through first filter layer 910, the second filter layer 920 and the third filter layer 930. Further, the light transmitted through first filter layer 910, the second filter layer 920 and the third filter layer 930 can be absorbed by the first dielectric layer 710 and the second dielectric layer 720, so that more light can enter the non-light-emitting zone, thus improving the contrast of the display panel 10.

The display panel provided by the technical solution of the present disclosure comprises a flexible substrate, a thin film transistor layer, an anode layer, a light-emitting layer, a cathode layer and a photoresist layer arranged sequentially in a stacked manner, wherein the thin film transistor layer comprises a drain, the anode layer and the drain are electrically connected, the photoresist layer comprises a first photoresist layer, a second photoresist layer and a third photoresist layer arranged sequentially at intervals, all of the first photoresist layer, the second photoresist layer and the third photoresist layer are disposed on the surface of the cathode layer, a first dielectric layer filling the space between the first photoresist layer and the second photoresist layer, and a second dielectric layer filling the space between the second photoresist layer and the third photoresist layer are included, and the first dielectric layer and the second dielectric layer are used to absorb light incident from one side of the photoresist layer away from the cathode layer, thus improving the contrast of the display panel.

Figure 27:
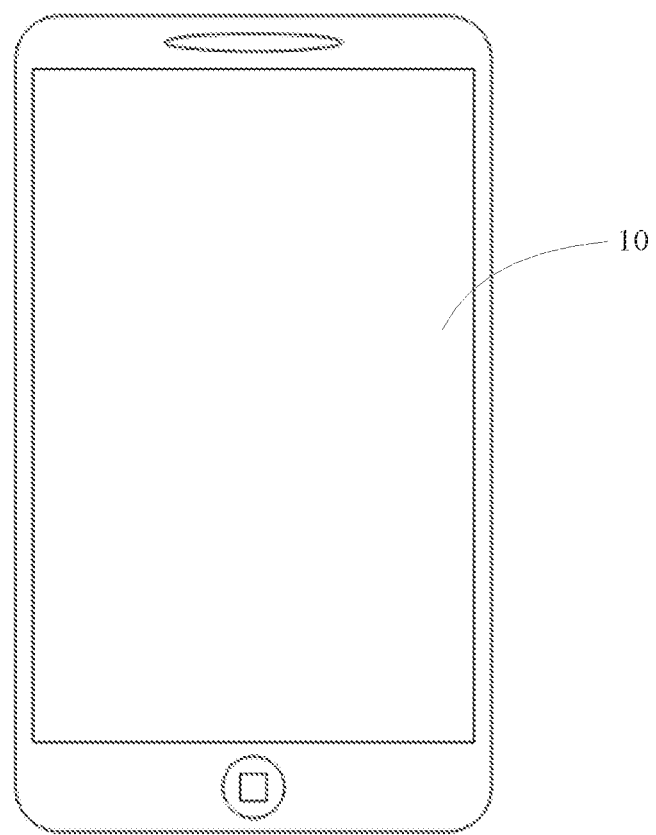
FIG. 27 is a schematic diagram of an electronic device provided by an implementation of the present disclosure.

See FIG. 27. FIG. 27 is a schematic diagram of an electronic device provided by an implementation of the present disclosure. The present disclosure further provides an electronic device, and the electronic device 1 comprises display panel 10, the display panel 10 can be display panel 10 provided by any of previous implementations, and it won't be covered here. The electronic device 1 can be, but not limited to, an electronic book, a smart phone (such as an Android phone, an iOS phone, a Windows Phone phone, and the like), a panel computer, a palm computer, a laptop, a mobile internet device or a wearable device and so on.

Above are detailed descriptions to the implementations of the present disclosure, specific examples are given to illustrate the principle and implementation of the disclosure, and above illustrations are only used to help understand the method of the disclosure and its core ideas. Meanwhile, various changes may be made to the implementations and application scope for those of ordinary skill in the art based on the ideas of the disclosure. In summary, the disclosure should not be interpreted as restricting the present disclosure.

What is claimed is:

1. A display panel, comprising a flexible substrate, a thin film transistor layer, an anode layer, a light-emitting layer, a cathode layer and a photoresist layer arranged sequentially in a stacked manner, wherein
the thin film transistor layer comprises a drain electrically connected with the anode layer;
the photoresist layer comprises a first photoresist layer, a second photoresist layer and a third photoresist layer arranged sequentially at intervals, and all of the first photoresist layer, the second photoresist layer and the third photoresist layer are disposed on a surface of the cathode layer;
a first dielectric layer filling the space between the first photoresist layer and the second photoresist layer, and a second dielectric layer filling the space between the second photoresist layer and the third photoresist layer are included, and the first dielectric layer and the second dielectric layer are used to absorb light incident from one side of the photoresist layer away from the cathode layer so as to improve the contrast of the display panel; and
wherein the display panel further comprises a thin film encapsulation layer and a color filter layer, and wherein the thin film encapsulation layer is disposed on a surface of the photoresist layer away from the cathode layer and used to protect the photoresist layer;
the color filter layer is disposed on a surface of the thin film encapsulation layer away from the photoresist layer;
the color filter layer comprises a first filter layer, a second filter layer and a third filter layer arranged sequentially and adjacently; the first filter layer is arranged opposite to at least a part of area of the first photoresist layer; the second filter layer is arranged opposite to at least a part of area of the second photoresist layer; the third filter layer is arranged opposite to at least a part of area of the third photoresist layer; and wherein
the second filter layer is configured to fit the first filter layer so as to cover the first dielectric layer, or the second filter layer is configured to fit the third filter layer so as to cover the second dielectric layer.

2. The display panel as claimed in claim 1, wherein the first photoresist layer is a red photoresist; the second photoresist layer is a green photoresist; the third photoresist layer is a blue photoresist; the first dielectric layer and the second dielectric layer are a same material; and a filling amount of the second dielectric layer is larger than that of the first dielectric layer.

3. The display panel as claimed in claim 1, wherein the first photoresist layer is a red photoresist; the second photoresist layer is a green photoresist; the third photoresist layer is a blue photoresist; the first dielectric layer and the second dielectric layer are different materials; and a density of the second dielectric layer is larger than that of the first dielectric layer.

4. The display panel as claimed in claim 1, wherein the first dielectric layer, the second dielectric layer and the anode layer are disposed in a first same layer; or
the first dielectric layer, the second dielectric layer and the light-emitting layer are disposed in a second same layer; or
the first dielectric layer, the second dielectric layer and the cathode layer are disposed in a third same layer.

5. The display panel as claimed in claim 1, wherein the light-emitting layer is an organic light-emitting layer.

6. The display panel as claimed in claim 1, wherein the anode layer is disposed on a surface of the drain and the anode layer is electrically connected with the drain.

7. A manufacturing method of a display panel, wherein the manufacturing method of a display panel comprises:
providing a flexible substrate;
forming a thin film transistor layer covering the flexible substrate, the thin film transistor layer comprising a drain;
forming an anode layer covering the thin film transistor layer, the anode layer and the drain being electrically connected;
forming a light-emitting layer covering the anode layer;
forming a cathode layer covering the light-emitting layer;
forming a photoresist layer covering the cathode layer, the photoresist layer comprising a first photoresist layer, a second photoresist layer and a third photoresist layer arranged sequentially at intervals, all of the first photoresist layer, the second photoresist layer and the third photoresist layer being disposed on a surface of the cathode layer;
forming a first dielectric layer filling a first space between the first photoresist layer and the second photoresist layer;
forming a second dielectric layer filling a second space between the second photoresist layer and the third photoresist layer, and the first dielectric layer and the second dielectric layer being used to absorb light incident from one side of the photoresist layer away from the cathode layer so as to improve contrast of the display panel;
wherein the manufacturing method of the display panel further comprises:
forming a thin film encapsulation layer covering the photoresist layer, the thin film encapsulation layer being used to protect the photoresist layer;
forming a color filter layer covering the thin film encapsulation layer, the color filter layer comprising a first filter layer, a second filter layer and a third filter layer arranged sequentially and adjacently, the first filter layer being arranged opposite to at least a part of area of the first photoresist layer, the second filter layer being arranged opposite to at least a part of area of the second photoresist layer, the third filter layer being arranged opposite to at least a part of area of the third photoresist layer, and wherein the second filter layer is configured to fit the first filter layer so as to cover the first dielectric layer, or the second filter layer is configured to fit the third filter layer so as to cover the second dielectric layer.

8. The manufacturing method of the display panel as claimed in claim 7, wherein the light-emitting layer is an organic light-emitting layer.

9. The manufacturing method of the display panel as claimed in claim 7, wherein the anode layer is disposed on a surface of the drain, and the anode layer is electrically connected with the drain.

10. An electronic device comprising a display panel, the display panel comprising a flexible substrate, a thin film transistor layer, an anode layer, a light-emitting layer, a cathode layer and a photoresist layer arranged sequentially in a stacked manner, wherein
the thin film transistor layer comprises a drain electrically connected with the anode layer;
the photoresist layer comprises a first photoresist layer, a second photoresist layer and a third photoresist layer arranged sequentially at intervals, and all of the first photoresist layer, the second photoresist layer and the third photoresist layer are disposed on a surface of the cathode layer;

a first dielectric layer filling the space between the first photoresist layer and the second photoresist layer, and a second dielectric layer filling a first space between the second photoresist layer and the third photoresist layer are included, and the first dielectric layer and the second dielectric layer are used to absorb light incident from one side of the photoresist layer away from the cathode layer so as to improve contrast of the display panel; and wherein the display panel further comprises a thin film encapsulation layer and a color filter layer, and wherein the thin film encapsulation layer is disposed on a surface of the photoresist layer away from the cathode layer and used to protect the photoresist layer;

the color filter layer is disposed on a surface of the thin film encapsulation layer away from the photoresist layer;

the color filter layer comprises a first filter layer, a second filter layer and a third filter layer arranged sequentially and adjacently; the first filter layer is arranged opposite to at least a part of area of the first photoresist layer; the second filter layer is arranged opposite to at least a part of area of the second photoresist layer; the third filter layer is arranged opposite to at least a part of area of the third photoresist layer; and wherein the second filter layer is configured to fit the first filter layer so as to cover the first dielectric layer, or the second filter layer is configured to fit the third filter layer so as to cover the second dielectric layer.

11. The electronic device as claimed in claim 10, wherein the first photoresist layer is a red photoresist; the second photoresist layer is a green photoresist; the third photoresist layer is a blue photoresist; the first dielectric layer and the second dielectric layer are same materials; and a filling amount of the second dielectric layer is larger than that of the first dielectric layer.

12. The electronic device as claimed in claim 10, wherein the first photoresist layer is a red photoresist; the second photoresist layer is a green photoresist; the third photoresist layer is a blue photoresist; the first dielectric layer and the second dielectric layer are different materials; and a density of the second dielectric layer is larger than that of the first dielectric layer.

13. The electronic device as claimed in claim 10, wherein the first dielectric layer, the second dielectric layer and the anode layer are disposed in a first same layer; or the first dielectric layer, the second dielectric layer and the light-emitting layer are disposed in a second layer; or the first dielectric layer, the second dielectric layer and the cathode layer are disposed in a third layer.

14. The electronic device as claimed in claim 10, wherein the light-emitting layer is an organic light-emitting layer.

* * * * *